United States Patent [19]

Punch et al.

[11] Patent Number: 4,539,499

[45] Date of Patent: Sep. 3, 1985

[54] DEVICE FOR DETECTION OF CONTACT BETWEEN ROTOR AND STATOR

[76] Inventors: William E. Punch, 2951 Lenox Ave., Jacksonville, Fla. 32205; Robert E. Weekley, 543 N. Jackson, Medford, Wis. 54451

[21] Appl. No.: 567,677

[22] Filed: Jan. 3, 1984

[51] Int. Cl.³ ..................... G08B 21/00; H02K 3/487
[52] U.S. Cl. ..................... 310/214; 310/42; 340/648
[58] Field of Search ............ 310/68 R, 68 C, 72, 310/214; 324/51, 54, 158 MG; 200/23, 24, 26, DIG. 7; 340/648, 679, 682, 45

[56] References Cited

U.S. PATENT DOCUMENTS

| | | | |
|---|---|---|---|
| 1,001,152 | 8/1911 | Lawrence | 340/682 |
| 2,794,136 | 5/1957 | Kalikow et al. | 340/682 |
| 2,805,677 | 9/1957 | Baird | 340/682 |
| 3,373,300 | 3/1968 | Sullivan | 340/682 |
| 4,227,108 | 1/1984 | Washizu et al. | 310/45 |
| 4,326,677 | 4/1982 | Schippers et al. | 340/682 |
| 4,379,291 | 4/1983 | Hubbard et al. | 340/682 |

*Primary Examiner*—Peter S. Wong
*Assistant Examiner*—D. L. Rebsch
*Attorney, Agent, or Firm*—Arthur G. Yeager

[57] ABSTRACT

A device to detect electrical contact between a stator and a rotor in an electrical power machine comprising a plurality of thinly insulated electrical conductors extending across the face of the stator and spaced about the circumference of the stator in close proximity to said rotor, and means to signal any electrical contact between said rotor and said conductors. This device is particularly useful in detecting worn shaft bearings.

10 Claims, 8 Drawing Figures

U.S. Patent    Sep. 3, 1985    4,539,499
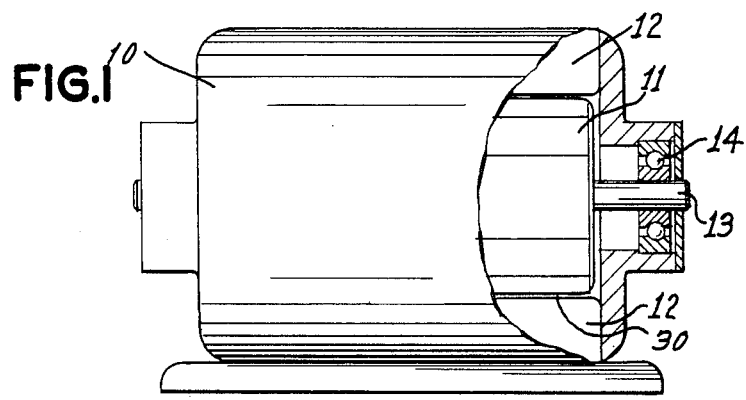
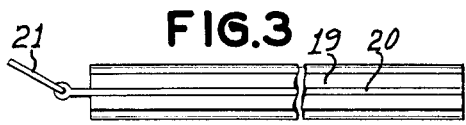
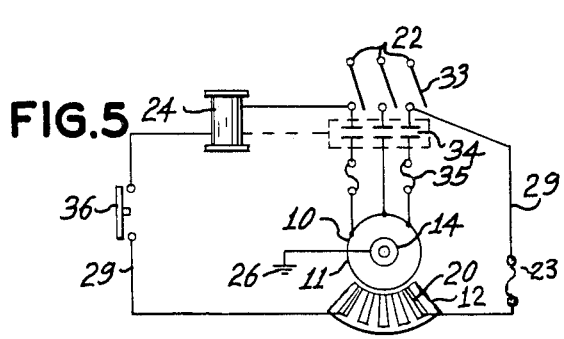
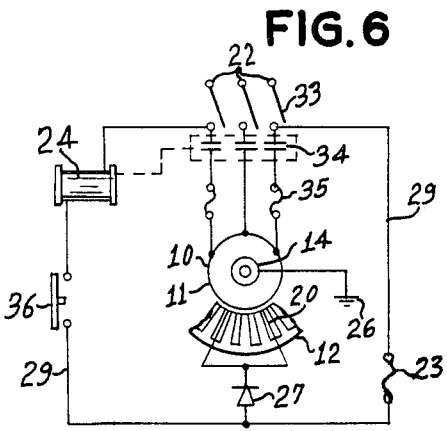
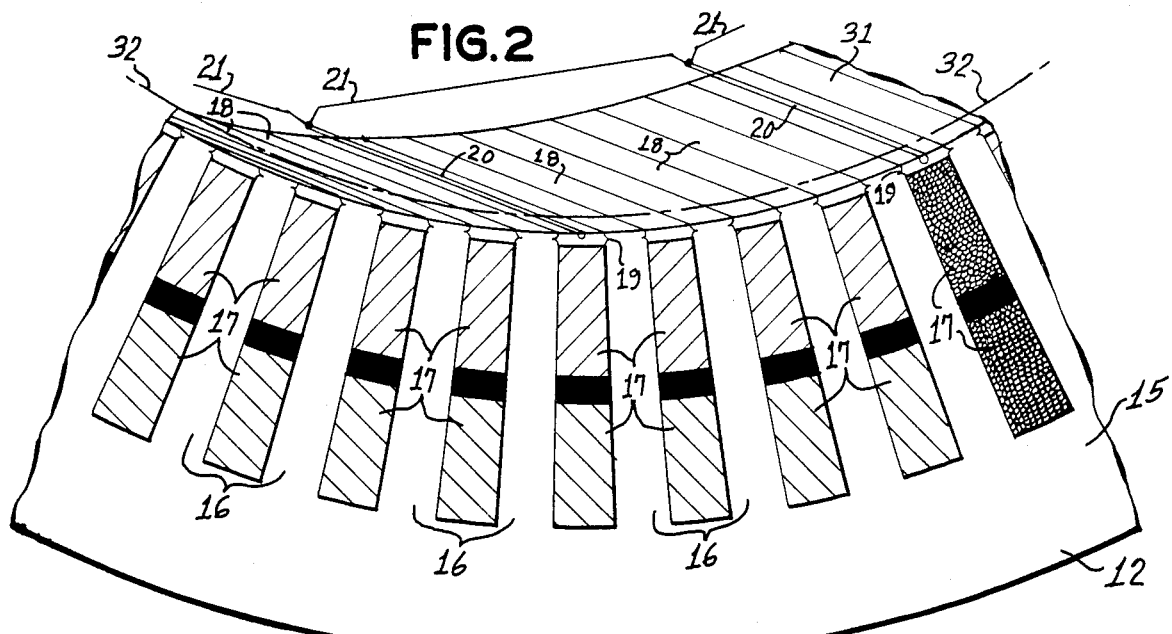
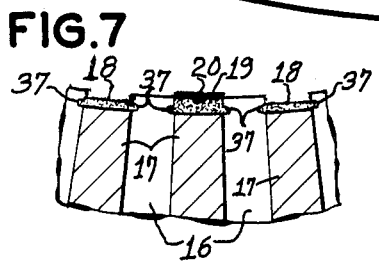
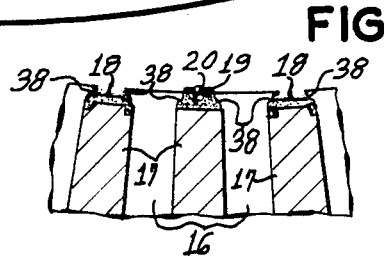

DEVICE FOR DETECTION OF CONTACT BETWEEN ROTOR AND STATOR

BACKGROUND OF THE INVENTION

It is well known that in electrical generators and electrical motors there is a cylindrical rotor which rotates about a shaft inside a cylindrical stator which is fixed to the frame of the machine. The rotor rotates at high speed and its surface must be very close to the surface of the stator in order to have an efficient machine. Any looseness in the bearings on which the rotor rotates, any weakness in the assembly of rotor components that might permit a part to break away from the rotor while rotating, or the presence of any foreign body between the rotor and stator may cause extensive and expensive damage to occur to the rotor and/or stator before that damage can be detected. Accordingly, it is important to have means for detecting impending damage before it occurs to any series extent.

It is an object of this invention to provide a means for detecting physical contact between the rotor and stator. It is another object of this invention to provide an improved means for detecting worn shaft bearings on a rotor. It is another object of this invention to detect any foregin body that is electrically conductive between the rotor and stator. Still other objects will be apparent from the more detailed description of this invention which follows.

BRIEF DESCRIPTION OF THE INVENTION

This invention relates to a device for detecting electrical contact between the stator and rotor of an electrical power machine comprising a plurality of thinly insulated electrical conductors extending across the face of the stator, fixed in closed proximity to the face of the rotor, and spaced circumferentially around the face of the stator, said conductors being electrically connected to means for signalling electrical contact between said rotor and one of said conductors.

In a preferred embodiment of this invention, the electrical conductor is a wire embedded in the surface of an insulating wedge between adjacent teeth of the stator, with a portion of the surface of the wire exposed along the length of the wedge and coated with an insulating varnish. In another preferred embodiment of this invention the electrical conductors are part of an electrical circuit including a fuse which upon electrical contact between the stator and the rotor will be activated to break the power circuit operating the machine.

BRIEF DESCRITION OF THE DRAWINGS

The novel features believed to be characteristic of this invention are set forth with particularly in the appended claims. The invention itself, however, both as to its organization and method of operation, together with further objects and advantages, may best be understood by reference to the following description taken in connection with the accompanying drawings in which:

FIG. 1 is a schematic illustration, partly in cross-section, of an electric power machine having a rotor and stator whic may be employed with this invention;

FIG. 2 is a schematic illustration in perspective of a portion of the stator of a machine employing the device of this invention;

FIG. 3 is a top plan view of one type of insulating wedge with an embedded electric conductor;

FIG. 4 is an end elevational view of the wedge shown in FIG. 3;

FIG. 5 is an electric circuit diagram for one embodiment of the operation of the device of this invention.

FIG. 6 is an electric circuit diagram for another embodiment of the operation of the device of this invention;

FIG. 7 is a partial illustration of one type of wedge employed in this invention.

FIG. 8 is a partial illustration of another type of wedge employed in this invention.

DETAILED DESCRIPTION OF THE INVENTION

In FIG. 1 there is shown an electric motor 10 having a rotor 11 mounted on a shaft 13 and bearings 14 so as to rotate in stator 12. The space between rotor 11 and stator 12 is very small, so as to reduce the power losses and increase the efficiency of the machine. Nevertheless, this small air gap 30 must be maintained because any contact between the rotating rotor and the fixed stator will obviously result in damage to one or both. The most likely cause of such unintended contact is the wearing of bearing 14, causing shaft 13 and rotor 11 to fall downward. Another cause for contact may be the breaking loose of a wire, screw, or other component part of rotor 11 with the result that it is thrown outward against stator 12 by centrifugal force. Still another cause for contact is the accidental intrusion of some foreign body, such as dirt, metal particles, or the like, between the rotor and stator. Any object which causes scratching of one of the mating surfaces of the rotor and stator may accelerate and enlarge the damage because of the high speed of rotation of the rotor, with the result that extensive costly damage may occur which might have been prevented, if there was some knowledge of the first small contact between the rotor and stator and the machine could have been taken out of operation before major damage occurred.

In FIGS. 2-4 there may be seen the device of this invention for detecting imminent contact between the rotor 11 and the stator 12. In FIG. 2 there is shown in detail the arrangement of the stator 12 which accomplishes this purpose. Stator 12 has an iron body 15 with teeth 16 projecting radially inward toward the central axis of cylindrical face 31 which is concentric with the outer cylindrical face of rotor 11 (indicated by dotted line 32 in FIG. 2). In the spaces between teeth 16 are coils 17 which provide the electric field for the machine. Coils 17 are normally retained in place by wedges 18 of insulating material which serve as a cap to hold the coils in the slots between teeth 16. Spaced around stator in perhaps 4-12 locations, wedge 18 is replaced by wedge 19 which is to retain coils 17 the same as wedge 18 except it has two unique features: (1) it contains a nonmagnetic electric conductor extending lenghtwise of the wedge and (2) wedge 19 is made thick enough to position conductor 20 above face 31 into air gap 30 a small amount, normally 0.001 to 0.1 inch. Conductor 20 preferably is a copper wire. Conductors 20 are connected to an electric circuit through connecting wires 21. Preferably conductor 20 and the top surface of wedge 19 is coated with an insulating varnish. When rotor 11 becomes displaced from its original position for any reason, e.g., worn bearings 14, or when a foreign body intrudes into space 30, the insulating varnish on conductor 20 will be eroded away and electrical contact will eventually be made between rotor 11 and conductor 20 which will signal by any convenient means, e.g., a light, a buzzer, a bell, or the like, that damage producing contact between rotor 11 and stator 12 is imminent. Wedges 18 and 19 and teeth 16 are fashioned so as to keep coils 17 in place. In FIGS. 2, 3, 4 and 7 this is accomplished by grooves on teeth 16 and corresponding flanges on wedges 18 and 19. In FIG. 8 there is shown an alternate design with flanges on teeth 16 and a corresponding trapezoidal shape of wedges 18 and 19. Any other design to accomplish the same purpose is operable within the scope of this invention.

In FIG. 5 there is shown an electric circuit which is a preferred embodiment of the means to signal a contact between rotor 11 and conductor 20. Three-phase power source 22 furnishes the power to run motor 10. Power passes through main switch 33, motor contactors 34, and overload relays 35 to motor 10. The circuit that is of interest to this invention includes fuse 23 holding coil 24, start-stop button 36, conductors 20, and the line 29 connecting these components. When the normal design voltage in line 29 passes through holding coil 24, it provides the energy to keep contactors 34 closed upon each other so as to permit line voltage to drive motor 10. With no current in line 29 motor 10 cannot operate because contactors 34 will be open. Several conductors 20 are spaced around the face of stator 12 connected to series to line 29. Rotor 11 is grounded at 26 through bearing 14. When rotor 11 makes an electric contact with stator 12 by contacting conductor 20, excessive current will flow from source 22 through line 29, fuse 23, conductor 20, and rotor 11 to ground 26. If fuse 23 is of the proper rating, that current will cause fuse 23 to break the circuit, deenergizing coil 24, and causing contactors 34 to open, and thereby shut the machine down, to prevent further damage to rotor 11, stator 12, or coils 17.

In FIG. 6, an alternate preferred embodiment is similar to that of FIG. 5 in many aspects. In FIG. 6 diode 27 connects in parallel to the several conductors 20 in stator 12. The same type of action occurs when rotor 11 contacts conductor 20 on stator 12. Fuse 23 breaks the circuit of line 29. Coil 24 is deenergized and opens contactors 34 to shut down motor 10.

FIGS. 7 and 8 show alternate embodiments of wedges 19 for the designs of teeth 16 of stator 12. In FIG. 7 each tooth is formed with a groove 37 on each side, adjacent the top of the tooth and parallel to the cylindrical surface 31 of stator 12. Wedges 18 and 19 are made with flanges to fit groves 37, and this permits wedge 18 or 19 to be driven snugly into place by inserting the wedge into the grooves lengthwise. Wedge 19 is thicker than wedge 18, so it will extend slightly above the top of teeth 16 while wedges 18 are slightly below the top of teeth 16. In FIG. 8 the top of teeth 16 are spread outwardly to form a flange 38. Wedges 18 and 19 are shaped correspondingly so they may be slid in lengthwise and be jammed between coils 17 and flanges 38. Wedges 19 is thick enough to have its upper surface above the top of teeth 16 while wedge 18 is a channel shaped article which is slightly below the top of teeth 16. Both the designs of wedges 18 in FIGS. 7 and 8 are commonly used in industry, and the device of this invention is intended to include these as well as any other equivalent design.

While the invention has been described with respect to certain specific embodiments, it will be appreciated that many modifications and changes may be made by those skilled in the art without departing from the spirit of the invention. It is intended, therefore, by the appended claims to cover all such modifications and changes as fall within the true spirit and scope of the invention.

What is claimed as new and what is desired to secure by Letters Patent of the United States is:

1. A device for detecting electrical contact between the stator and rotor of an electric motor and disabling the rotor to minimize the damage between the rotor and stator, comprising a plurality of spaced elongated insulting wedges about the stator for retaining coils of electrical conductors located in spaces of a stator between teeth of stator and providing a generally uniform smooth face with the rotor facing surfaces of the stator teeth, a plurality of elongated spaced non-magnetic generally round electrical conductors extending across the face of the stator, said non-magnetic conductors being embedded substantially within the upper surface of selected ones of said insulation wedges at widely spaced circumferential locations around the face of the stator, said non-magnetic conductors being fixed in said selected wedges in close proximity to the face of the rotor, insulation means overlying each of said non-magnetic conductors without inhibiting removal of said wedges from stator, said upper surface of said wedges containing said non-magnetic conductors and said insulation means being above the upper surfaces of the other of said wedges and above the face of the stator, means connected to said non-magnetic conductors for disabling the motor when the rotor causes a break in one of said insulation means and causes an electrical contact to be made between said rotor and one of said non-magnetic conductors beneath said one insulation means.

2. The device of claim 1 wherein said means connected to said non-magnetic conductors includes a fuse.

3. The device of claim 2 wherein said non-magnetic conductors are connected in series to a holding coil of the motor and in series with said fuse.

4. The device of claim 2 wherein said means connected to said non-magnetic conductors includes an electric circuit from a power source through said fuse to a diode and to said non-magnetic conductors, said rotor being grounded through its main shaft bearings upon electrical contact between said rotor and one of the said non-magnetic conductors.

5. The device of claim 1 wherein said non-magnetic electrical conductors are wires embedded lengthwise respective said insulating wedges with a portion of the surface of said wire being exposed along the entire length of said wedge, said insulation means being an insulating varnish applied to said exposed surface.

6. A system for detecting electrical contact between the stator and the rotor of an electric motor and disabling the motor to minimize damage between the stator and rotor wherein the rotor is mounted on a shaft journaled in bearings in a motor frame in which said stator is fixed, said stator comprising an annular iron body having a plurality of spaced teeth extending radially inward to a cylindrical surface in which the rotor rotates, the spaces between adjacent teeth being filled with coils of electrical conductors and the end of each space at said cylindrical surface being closed by a non-magnetic, electrically insulating wedge to retain the coil therein; selected ones of said wedges having non-magnetic generally round electrical conductors extending lengthwise thereof an substantially beneath the upper surface thereof and partially exposed over their entire length at said cylindrical surface, insulation means overlying each of said non-magnetic conductors without inhibiting removal of said wedges from said stator, said selected wedges containing said non-magnetic electrical conductors being spaced circumferentially around said cylindrical surface and connected to an electrical circuit, said electrical circuit including means for disabling said motor when the rotor causes a break in at least one of said insulation means and any physical contact is made between said rotor and one said mon-magnetic electrical conductor beneath said one insulation means.

7. The system of claim 6 wherein said electrical circuit includes a fuse and a holding coil for said motor, said fuse being interrupted to prevent any power input to the motor after physical contact is made between said rotor and said one non-magnetic conductor.

8. The system of claim 7 wherein said rotor is grounded through said bearings.

9. The system of claim 6 wherein said non-magnetic electrical conductors are connected in series in an electric circuit containing a fuse and a holding coil, said motor receiving its input electrical power through motor contactors which are closed when a normal current flows through said holding coil and open when excessive current flows through said holding coil and breaking said fuse open said rotor being grounded through said bearings.

10. The system of claim 7 wherein said non-magnetic electrical conductors are connected in parallel to a diode which in turn is connected to an electric circuit containing a fuse and a holding coil, said motor receiving its input electrical power through contacts which are closed when a normal current flows through said holding coil and opening when excessive current flows through said holding coil and breaking said fuse open said rotor being grounded through said bearings.

* * * * *